United States Patent [19]

Wasa et al.

[11] 4,288,307

[45] Sep. 8, 1981

[54] METHOD OF MAKING A MAGNETIC HEAD

[75] Inventors: Kiyotaka Wasa, Nara; Takao Tohda, Ikoma; Kazuo Yokoyama, Osaka; Eiichi Hirota; Shigeru Hayakawa, both of Hirakata, all of Japan

[73] Assignee: Matsushita Electric Industrial Co., Ltd., Kadoma, Japan

[21] Appl. No.: 122,809

[22] Filed: Feb. 19, 1980

[51] Int. Cl.$^3$ ............................................. C23C 15/00
[52] U.S. Cl. ............................... 204/192 D; 204/298; 29/603
[58] Field of Search .......... 204/192 D, 192 M, 192 R, 204/192 C, 298; 29/603

[56] References Cited

U.S. PATENT DOCUMENTS 3,775,277 11/1973 Pompei et al. ................. 204/192 D

FOREIGN PATENT DOCUMENTS 4726888 7/1972 Japan ............................. 204/192 D

OTHER PUBLICATIONS

C. W. Pitt et al., "Automatic Monitoring of Deposition Conditions During RF Sputtering of Dielectric Materials", *Vacuum,* vol. 25, pp. 265–221, (1975).

*Primary Examiner*—Aaron Weisstuch
*Attorney, Agent, or Firm*—Wenderoth, Lind & Ponack

[57] ABSTRACT

In a method of making a magnetic gap by depositing a glass layer on a surface of magnetic head core materials by cathodic sputtering of a glass target and cementing a pair of the resulting glass-coated magnetic head core materials, the improvements constituted by monitoring the thickness of the sputtered glass layer by an interference of a light beam guided onto a surface of the magnetic head core materials during the deposition and using a sputtering apparatus having a sample holder beside the target for securing the magnetic core materials and a mask plate for achieving uniform thickness of the sputtered glass layer.

The method makes possible production of magnetic heads having excellent electromagnetic conversion characteristics with high accuracy.

13 Claims, 11 Drawing Figures

METHOD OF MAKING A MAGNETIC HEAD

BACKGROUND OF THE INVENTION

This invention relates to an improved method of making a magnetic gap, and more particularly relates to an improved method of making a magnetic head having excellent electromagnetic conversion characteristics.

A magnetic gap has been used widely for making magnetic heads for recording and reproducing video signals and sound signals. In production of the magnetic gap, a non-magnetic spacer for the operative gap has been formed from glass material. There are several methods known for making such a glass gap. For instance, a magnetic head core material is first immersed in a mixed solution of finely-crushed glass, than taken out and subjected to centrifugation so that a homogeneous layer of said pulverized glass is deposited on the opposing gap surfaces of the core menbers. After forming a glass film on said core surfaces by firing the thus deposited glass layer, the two opposing gap faces are butted against each other with said glass film sandwiched therebetween and fused together by a heat treatment to form the desired operative gap. These methods for making a magnetic gap according to the prior art have disadvantages such that they are difficult to use in the production of magnetic gaps with high precision because of difficulty in controlling the film thickness of the fired glass.

Cathode sputtering has been proposed as another method for depositing said glass films in order to produce the magnetic head gap. At present, however, it is quite doubtful that a conventional cathode sputtering technique can provide magnetic head gaps with high accuracy. The reasons are that (i) the magnetic core materials such as Mn-Zn ferrite are often damaged by the of plasma radiation during the sputtering deposition; (ii) the thickness accuracy of deposited films obtained in a conventional sputtering apparatus is around 10 to 20% when operating at a production scale, and higher accuracy is necessary for making said magnetic head gaps; (iii) reliable techniques for directly monitoring the thickness of the sputtered glass layer on the magnetic core materials are not well established, because the well-known quartz thickness monitor system is not adaptable for the direct monitoring of the glass layer thickness during sputtering deposition.

This invention relates to major improvements in the method of making the magnetic head gaps by cathodic sputtering.

SUMMARY OF THE INVENTION

It is an object of the present invention to provide a novel and improved method of depositing a glass layer wherein the thickness of the layer can be precisely controlled by using a cathodic sputtering step.

Another object of the present invention is to provide a novel and improved method of making magnetic gaps wherein the length of the magnetic gap can be precisely controlled.

Still another object of the present invention is to provide a novel and improved method of making magnetic heads having excellent electromagnetic conversion characteristics which are suitable for use in a video tape recording system.

These objects are realized by the method in accordance with the present invention, which comprises the steps of depositing a thin glass layer on a surface of magnetic head core materials by an RF-sputtering step and cementing a pair of the resulting surface-coated magnetic head core materials and which is characterized by the fact that the thickness of the thin glass layer is precisely monitored by a light beam guided onto the surface of said magnetic head core materials during said sputtering deposition.

BRIEF DESCRIPTION OF THE DRAWINGS

These and othere objects and features of the present invention will become apparent from consideration of the following detailed description of the preferred embodiments of the invention and the attached drawings, wherein.

DESCRIPTION OF THE PREFERRED EMBODIMENTS

Before describing an embodiment of the method of the invention, the construction of a magnetic head made by the method of the present invention will be briefly described for facilitating an understanding of the invention.

Figure 1:
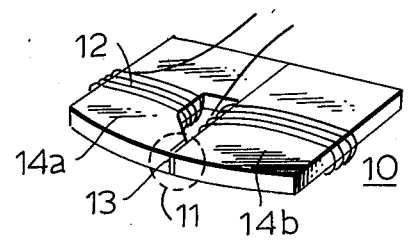
FIG. 1 is a perspective view illustrating a typical construction of a magnetic head produced by the method of the present invention.

FIG. 1 shows a typical construction of a magnetic head provided by the method of the present invention. Referring to FIG. 1, the magnetic head 10 comprises a magnetic gap 11 and a winding 12. Said magnetic gap 11 is composed of a non-magnetic spacer 13 such as a thin glass layer which is sandwiched between a pair of magnetic head cores 14a and 14b.

Figure 2A:
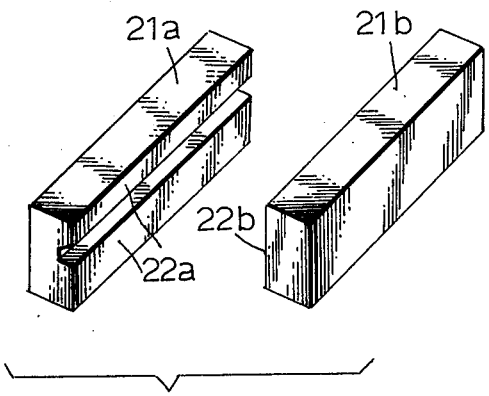
FIGS. 2A and 2B are perspective and elevational views illustrating the construction of unilateral magnetic core and glass-coated magnetic core pieces which are used in the method of the present invention for making the magnetic gap.
Figure 2B:
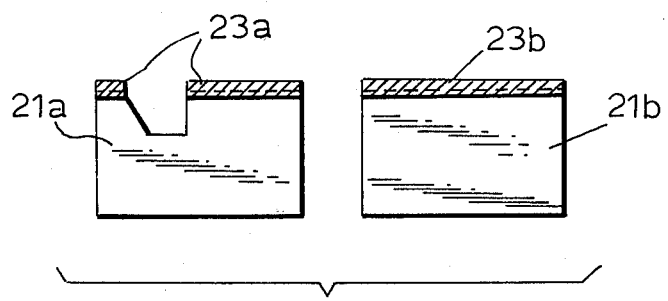

FIG. 2 shows constructions of magnetic core pieces which are used in the method of the present invention for making the magnetic gap. Referring to FIG. 2A, in a process of making the magnetic gap, a magnetic core material such as Mn-Zn ferrite is first cut and machined to prepare a pair of unilateral core pieces 21a and 21b having opposing gap faces 22a and 22b, and then said opposing gap faces are mirror finished. Referring to FIG. 2B, said mirror finished opposing gap faces are further subjected to a cathodic sputtering to form thin non-magnetic layers 23a and 23b of a material such as glass which are to serve as the gap spacer. Finally, these unilateral core pieces are butted against each other, with said gap spacers 23a and 23b sandwiched therebetween and are cemented together.

In the method of making a magnetic gap by depositing a thin glass layer on the surfaces of magnetic head core materials by cathodic sputtering and cementing a pair of the resulting glasscoated magnetic head core pieces together, as described hereinbefore, the present invention provides a major improvement in the cathodic sputtering step so as to make it possible to produce a magnetic gap wherein the thickness of the glass layer is precisely controlled. This makes it possible to produce magnetic heads having excellent electromagnetic conversion characteristics because the length of the magnetic gap is precisely controlled.

Figure 3A:
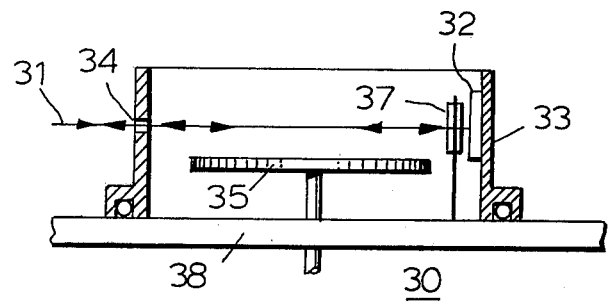
FIGS. 3A and 3B are a schematic cross-sectional view and a perspective view, respectively, of the cathodic sputtering apparatus for making the magnetic gap according to the present invention.
Figure 3B:
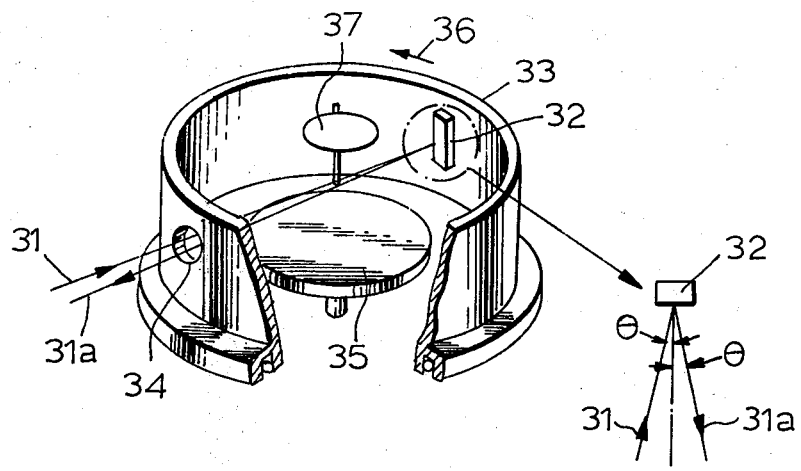

FIG. 3 shows the basic construction of an apparatus used in a cathodic sputtering step according to the present invention for depositing a thin glass layer onto the surfaces of magnetic head core materials such as unilateral Mn-Zn ferrite. The improved cathodic sputtering step for depositing a thin glass layer according to the invention comprises monitoring the thickness of the deposited glass layer by interference of a light beam which is parallel to the target surface and is guided onto a surface of the magnetic core materials during the deposition of said glass layer. Referring to FIGS. 3A and 3B, the sputtering apparatus 30 has a sample holder 33 for holding said magnetic core material 32 and which also serves as an anode electrode and which is also rotatable around the peripheral edge of the cathode target 35. Said sample holder has an opening 34 through which said light beam 31 is guided onto the surface of said magnetic core material 32 once during each rotation of the sample holder around the side edge of cathode target 35 in the direction of the arrow designated by 36. The present sputtering apparatus has a mask plate 37 which prevents an excess of sputtered particles from said cathode target 35 from being deposited onto said magnetic core material 32. Said mask plate 37 is positioned between said target 35 and said magnetic core material 32 and secured to the base 38 of said cathodic sputtering apparatus 30. Said cathode target 35 is composed of glass such as borosilicate glass. The RF-sputtering step is suitable for sputtering said glass target.

If has been discovered that in accordance with the present invention, the novel configuration of said cathodic sputtering apparatus 30 described in FIG. 3 makes it possible to produce said glass layer with high accuracy.

In conventional planar diode sputtering, the sample holder is mounted on an anode plate facing the cathode target. In the sputtering apparatus 30 according to the present invention, the sample holder is positioned to the side of the cathode. This makes it possible to reduce radiation damage to the magnetic core material.

Figure 4:
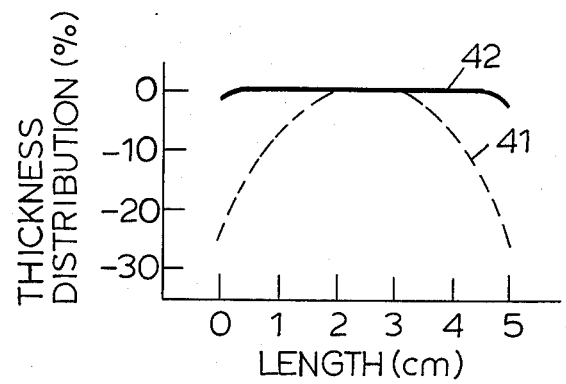
FIG. 4 is a graph showing a typical characteristics of the thickness distribution of the sputtered glass layer according to the present invention.

In conventional planar diode sputtering, large thickness variations are observed when the sample holder is positioned to the side of cathode. In the present sputtering apparatus, the thickness variations are reduced by utilizing the mask plate 37. FIG. 4 shows the effect of the mask plate on the thickness variations. Referring to FIG. 4, the typical thickness variation along the length of a unilateral core piece made without a mask plate is shown in curve 41, wherein a large thickness variation is observed and a maximum thickness is obtained at the center of said core piece. However, when a mask plate is used and said sample holder is rotated around the target, part of the sputtered glass particles are stopped by the mask plate and therefore the thickness variation shown by the curve 41 is altered. It has been discovered that in accordance with the present invention, a suitable choice of the mask pattern, for instance an ellipse-like pattern, can reduce the thickness variation as shown in curve 42. The thickness variation in the glass layer produced in the sputtering apparatus according to the present invention was less than 2%.

It has been also discovered that in accordance with the present invention, the thickness of the sputtered glass layer can be directly monitored during sputtering deposition in said cathodic sputtering apparatus 30 merely by detecting the intensity of the reflected light 31A illustrated in FIG. 3B.

The principle of the thickness monitor used in the present invention is briefly described below in order to facilitate an understanding of the features of the invention.

The reflected light 31A comprises two different reflected light portions; one is reflected light from the interface of the glass layer and the magnetic core material, and the other is reflected light from the surface of the sputtered glass layer. Due to a small difference $2d$ in the length of the light path of these two reflected light portions, there appears a phase difference $\Delta\phi \simeq 4\pi d/n\lambda$ between said two light portions and thus these two light portions interfere with each other, (d and n denote the thickness and optical index of the sputtered glass layer, respectively, and $\lambda$ denotes the wavelength of the light beam). The interference causes periodic variation of the light intensity corresponding to thickness d of said glass layer, wherein the period is given by $n\lambda/4$.

Figure 5A:
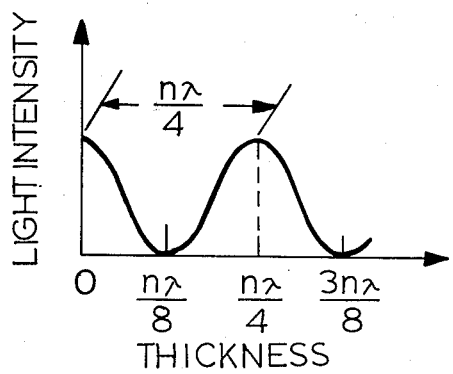
FIGS. 5A and 5B are graphs showing typical characteristics of the thickness monitoring system for use in making a sputtered glass layer according to the present invention.
Figure 5B:
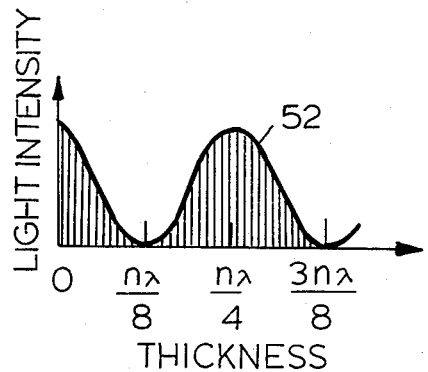

FIGS. 5A and 5B show a typical variation of the reflected light intensity corresponding to the thickness d of the sputtered glass layer. Referring to FIG. 5A, it is easily understood that the thickness of the sputtered glass layer can be monitored during deposition by detecting the intensity of the reflected light beam 51, if the optical index n of the glass layer being deposited and the wavelength $\lambda$ of the light can be fixed.

In the present state of art, $\lambda$ can be easily fixed by using monochromatic light such as laser light. However, it is not clear whether the value n can be fixed or not. The reason is that the chemical composition of the sputtered glass layer may be not constant in a production scale process. This may result in a variation of n during production of said glass layer.

It has been discovered that in accordance with the present invention, there exist preferred conditions for said sputtering: When said cathode target is made of borosilicate glass and the target is RF sputtered, the n of the sputtered glass layer is found to vary very little during a long sputtering run. This makes it possible to produce a glass layer with a close thickness tolerance with high reproducibility.

It has been found that in accordance with the present invention there exists an optimum wavelength of said light beam and rotating speed of said sample holder for making said magnetic heads with high accuracy. For any process of making said magnetic heads, it has been found that the accuracy of the thickness of said glass layer should be around 1 to 2%. For achieving said accuracy, in accordance with the present invention, the half period of said light beam intensity described in FIG. 5 should be shorter than the thickness of said glass layer, and said λ should be λ<8 d/n. Also in accordance with the present invention, when said sample holder rotates around the target, the actual electrical signal obtained from said reflected light beam is a pulsed signal 52, as shown in FIG. 5B, and the accuracy of measurement of the thickness of said glass layer is determined by the separation of these pulsed signals. High rotating speeds improve the accuracy, and the rotating speed N(r·p·m) of said sample holder should be $N>50 V_{dep}/n\lambda$, where $V_{dep}$ denotes the deposition speed of said glass layer per minute. For achieving these preferable conditions, when making magnetic heads wherein the gap length is longer than 0.25 μm, a He-Ne gas laser in which λ=6328 Å is preferred. The value of $V_{dep}$ is typically 20 Å/min. For a value of n≃1.5, N>0.1. In practice, the optimum value of N is 0.3 to 1. A higher value of N is not usable in such a vaccum system.

It has been confirmed that according to the present invention, in a large scale production process the accuracy of the thickness of the glass layer obtained is better than 2% under the optimum monitoring conditions described hereinbefore and this makes it possible to make said magnetic heads with high reproducibility. Referring again to FIG. 3B, for an incident angle, θ, of said light beam onto said surface of the magnetic material 32, it has been found that in accordance with the present invention, there exists a preferred angle for monitoring the thickness of said glass layer with high accuracy. The preferred angle has been found to be 0.3° to 10°, and more preferably has been found to be 0.5° to 5°. At an angle less than 0.3°, the reflected light beam 31A and the incident light beam 31 overlap each other. This causes difficulty in measuring the intensity of said reflected light beam with high accuracy. At an angle of more than 10°, the dimensions of said opening increase and this results in a decrease in the amount of said magnetic materials which can be processed during one sputtering run. The size of said light beam should be less than 1 mm. For a sputtering system with a cylindrical sample holder having a diameter of 10 to 30 cm, the most preferred angle has been found to be 0.5° to 5°.

It has also been found that in accordance with the present invention, there exists a preferred design of a structure and materials for making said cathode sputtering apparatus 30. Stainless steel and chromium metallized copper are preferred for making said sample holder, since the surface of these materials will remain clean during a long sputtering run. The magnetic head core materials such as Mn-Zn ferrite should be secured to said sample holder by pressing said magnetic materials by a flexible spring sheet so as to reduce surface damage which arises from mechanical stress applied by the sample holder. The spring sheet also secures the magnetic core materials closely to said sample holder. The spring sheet should be composed of material selected from stainless steel, chromium metallized spring steel, and chromium metallized phosphor bronze. The metallization of these spring metals by chromium will reduce their surface contamination during said deposition by sputtering. These holding means make it possible to produce a stable reflected light signal.

The sample holder in said sputtering apparatus 30 should have a concave form so as to reflect light strongly during said thickness monitoring procedure. A cylindrical form is the most preferred structure for the sample holder. In said concave sample holder, said mask plate 37 is preferably comprised of a bent sheet so as to attain a uniform thickness of said sputtered glass layer during a long sputtering run. In a long sputtering run, the mask plate is often deformed due to stress induced by the sputtered glass layer deposited on the mask plate. In order to reduce the deformation of said mask plate, the mask plate should be comprised of a member selected from stainless steel, silica glass, and alumina ceramic.

Figure 6:
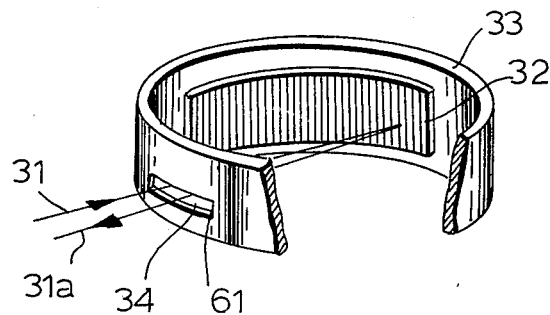
FIG. 6 is a perspective view illustrating a configuration of the thickness monitoring system for use in making the sputtered glass layer according to the present invention.

It has been found that the opening 34 disturbs the uniformity of the sputtered glass layer near the opening. The thickness variation observed near the opening is several percent. There exists a preferred shape of said opening 34 in the sputtering apparatus 30 so as to provide a uniform deposition of said sputtered glass layer. Referring to FIG. 6, said opening 34 should have a narrow rectangular form as shown at 61. The long rectangular opening which extends around the circumference of the cylinder 33 provides a high level of reflected light 31A. The width of said opening should be narrow. A wide width of said opening disturbs the uniformity of discharge of the sputtering and causes non-uniform deposition of said glass layer on said magnetic material 32. The length and the width of said opening are about 20 mm and 3 mm, respectively.

Further, in order more effectively to reduce the disturbance of said opening on the sputtering discharge, said opening should be covered with electrically conductive glass having optically transparent properties, such as NESA glass. With such a glass there is hardly any variation in the thickness of said sputtered glass layer.

In the sputtering apparatus 30 according to the present invention, the diameter of the disk target is 20 to 30 cm. The spacing between the target edge and the magnetic core materials is 2 to 7 cm. The sputtering deposition is conducted from a borosilicate glass target such as Pyrex glass (Corning Co. product) in a mixed gas of argon and oxygen at $5\times10^{-2}$ Torr, at a target power density of 0.5 to 2 watt/cm$^2$; the temperature of said magnetic materials such as Mn-Zn ferrite is from room temperature to 300° C.; the deposition speed of said glass layer, 0.05 to 0.15 μm/hr. These sputtering configurations and operating conditions are found to produce said glass layer on the magnetic head core materials with high accuracy in a large production scale process.

From the detailed description set forth hereinbefore, the features of the sputtering step according to the present invention will be well understood. Further, another improvement in said sputtering deposition will be described in the following for making it easy to understand the features of the invention in detail.

In the magnetic head, the gap length is usually 0.3 to 1 μm for video heads. For audio heads the gap length is larger than for the video head. The deposition speed described hereinbefore is ∼0.15 μm/hr or less, so higher speed is desired during production. However, the glass layer peels from the magnetic core materials when the deposition speed becomes higher than ∼0.15 μm/hr due to the stress induced in said glass layer.

In order to increase the deposition speed of said glass layer, it has been found that in accordance with the present invention, the glass layer must be comprised of a multilayered glass comprising a first layer and a second layer; said first layer is deposited by an RF-sputtering of a silica glass target or a Vicor glass target (Corning Co. products) in argon gas, and said second layer is deposited by RF-sputtering of a borosilicate glass target such as a Pyrex glass target in a mixture of argon and oxygen.

Since said first layer comprises high amounts of silicon oxides, it increases the adhesive strength of said glass layer for adhering it to said magnetic core materials. Said second layer acts as a gap spacer. In such a multilayered structure, high deposition speed of said glass layer can be achieved; typically said deposition speed is 0.3 to 0.6 μm/hr.

In sputtering said first layer, the mixture of argon and oxygen can also be used. Pure argon as described hereinbefore is very suitable for achieving said high deposition speed. In sputtering said second layer, the mixture of argon and oxygen is suitable as described hereinbefore. The oxygen partial pressure in the sputtering gas can reduce target composition changes during a long sputtering run. Preferred amounts of oxygen are 1 to 50% in said mixture. Below 1%, the target composition changes during a long sputtering run. Above 50%, the deposition speed decreases. The most preferred amounts of oxygen are 5 to 20%.

Figure 7:
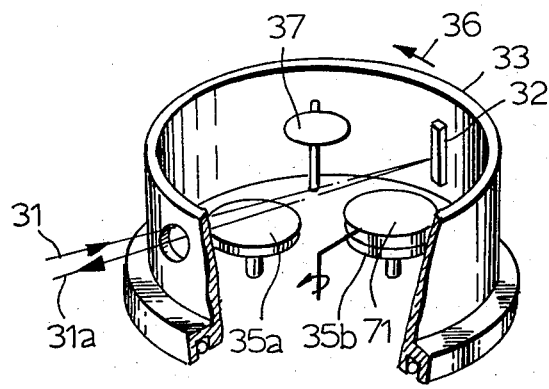
FIG. 7 is a perspective view illustrating a configuration of a multi-target sputtering apparatus for making a sputtered glass layer according to the present invention.

Further, it has been found that in accordance with the present invention, said multilayered glass layer can be produced with high reproducibility by using multi-target RF-cathodic sputtering. Referring to FIG. 7, the targets for such sputtering comprise silica glass target 35A and borosilicate glass target 35B, and a shutter plate 71 is selectively positioned above a target. The sputtering deposition is done in a manner such that firstly said silica glass target is sputtered alone while covering said borosilicate glass target 35B with said shutter plate 71 and secondly said borosilicate glass target 35B is sputtered alone while covering said silica glass target 35A with said shutter plate 71.

In the multi-target sputtering, said multi-layered structure can be deposited continuously without breaking the vacuum in the sputtering apparatus. This makes it possible to detect said reflected light beam with higher accuracy. This results in easy production of said magnetic head gap with high reproducibility.

Figure 8:
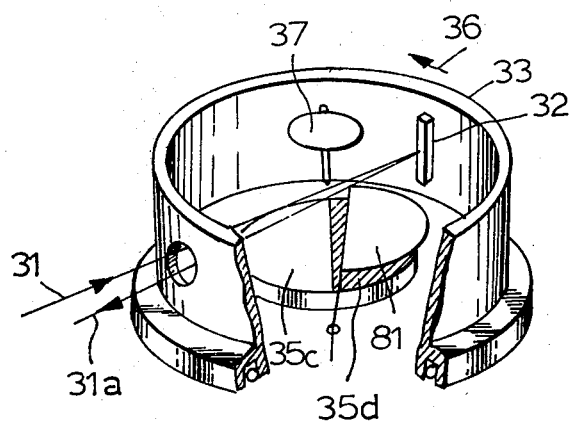
FIG. 8 is a perspective view illustrating a configuration of a single-target sputtering apparatus for making a sputtered glass layer according to the present invention.

Further, an improved single-target sputtering can be used for making said multi-layered structure. Referring to FIG. 8, in the improved sputtering method according to the present invention, part 35C of said single-target is composed of silica glass and the rest 35D is composed of borosilicate glass. A shield plate 81 is positioned above said target. The spacing between said shield plate and said target surface is less than the cathode dark space in the sputtering discharge. The sputtering deposition is carried out by first sputtering only said silica glass portion of said target while shielding said borosilicate glass portion 35D of said target with said shield plate 81 and secondly only said borosilicate glass portion 35D of said target is sputtered while shielding said silica glass portion 35C of said target with said shield plate 81.

The improved single target sputtering according to the present invention provides a simple method of sputtering since the RF-power for sputtering can be supplied to both glass target portions without the need for an electrical switching circuit. Said shield plate located in the cathode dark space as described hereinbefore acts as the equivalent of an electrical switch.

In the multi-layered structure, the thickness of said first layer and second layer is typically 0.1 to 1 μm. The magnetic gap obtained by these processes is, for instance, 0.3±0.01 μm.

The example described hereinbefore shows the utility of RF-sputtering without an additional magnetic field. However, any other RF-sputtering method with an additional magnetic field including a sputtering method in which the magnetic field is parallel to the electrical field, or a magnetron sputtering method in which the magnetic field is transverse to the electrical field can also be used in the method of the invention. A planar magnetron target can be used as the target 35 in the present invention.

The method of the present invention is also useful for making magnetic heads for a computer system. Magnetic metal heads such as Sendust and Permalloy heads can also be made by the method of the present invention. In the process for making magnetic heads described hereinbefore, a pair of glass-coated magnetic cores is cemented to each other. However, said magnetic head can be also produced by cementing a glass-coated magnetic core piece to a magnetic core piece which has no glass coating. Multi-layer structures including triple or four-fold layers can also be produced by using the method of the present invention. These multi-layer structures are usable for making magnetic heads having a wide gap having excellent electromagnetic conversion characteristics.

What is claimed is:

1. A method of making magnetic head core pieces for use in making a magnetic gap formed by cementing together a pair of magnetic head core pieces at least one of which has the face within the joint coated with glass, said method comprising: depositing a glass layer on a surface of a magnetic head core piece made of a magnetic head core material by a cathodic sputtering of a glass target means by mounting said piece in a sample holder and, while carrying out said sputtering, rotating the sample holder around the target means with the surface of said piece facing in a direction lateral to the target means; positioning a mask plate between said target means and the circumferential path of said piece for preventing an excess of sputtered glass from being deposited onto said piece; and monitoring the thickness of the sputtered glass layer formed on said piece by directing a light beam of a wavelength λ directly onto said surface of said piece in a direction for producing an interference light beam reflected from said piece, the speed of rotation of said sample holder being at least 50 $V_{dep}/n\lambda$, in which $V_{dep}$ is the speed of deposition of the sputtered glass per minute and n is the refractive index of the deposited glass layer, whereby the intensity of the interference light beam is indicative of the thickness of the sputtered glass layer.

2. The method as claimed in claim 1, wherein the sample holder is made of a material selected from the group consisting of stainless steel and chromium metallized copper.

3. The method as claimed in claim 1, wherein said piece is secured in said sample holder by pressing said piece with a spring sheet.

4. The method as claimed in claim 3, wherein said spring sheet is made of a material selected from the group consisting of stainless steel, chromium metallized spring steel, and chromium metallized phosphor bronze.

5. The method as claimed in claim 1, wherein said sample holder is cylindrical in form.

6. The method as claimed in claim 1, wherein said mask plate is a bent sheet having an ellipse-like shape, and is made of a material selected from the group consisting of stainless steel, silica glass, and alumina ceramic.

7. The method as claimed in claim 1 in which said light beam is directed substantially diametrically across said rotating sample holder and substantially perpendicularly to the axis of rotation thereof.

8. The method as claimed in claim 1 in which said sample holder has an opening substantially diametrically across said sample holder from the position of said piece, and said light beam is directed onto said piece through said opening each time said sample holder rotates.

9. The method as claimed in claim 8, wherein said opening in the sample holder is a narrow rectangular opening.

10. The method as claimed in claim 8, wherein said opening is covered with electrically conductive glass having optically transparent properties.

11. The improvement as claimed in claim 1, wherein said glass layer is a multilayered glass layer having a first layer and a second layer, and said sputtering comprises RF-sputtering of a silica glass target in argon gas for depositing said first layer and RF-sputtering of a borosilicate glass target in a mixture of argon and oxygen for depositing said second layer.

12. The method as claimed in claim 11, wherein said target means comprises a silica glass target, a borosilicate glass target therebeside, and a shutter plate positioned above said targets and movable over one or the other of said targets, and the sputtering is carried out by first sputtering said silica target while covering said borosilicate glass target with said shutter plate, and secondly sputtering said borosilicate glass target while covering said silica glass target with said shutter plate.

13. The method as claimed in claim 11, wherein said target means comprises a silica glass part and a borosilicate glass part, and a shield plate positioned above said target and movable over one or the other of said parts, and the sputtering is carried out by first sputtering said silica glass part of said target while shielding said borosilicate glass part with said shield plate, and second by sputtering said borosilicate glass part of said target while shielding said silica glass part with said shield plate.

* * * * *